United States Patent
Roberts et al.

(10) Patent No.: US 6,931,579 B2
(45) Date of Patent: Aug. 16, 2005

(54) INTEGRATED EXCITATION/EXTRACTION SYSTEM FOR TEST AND MEASUREMENT

(75) Inventors: Gordon W. Roberts, Montreal West (CA); Mohamed Hafed, Montreal (CA)

(73) Assignee: McGill University, Montreal (CA)

( * ) Notice: Subject to any disclaimer, the term of this patent is extended or adjusted under 35 U.S.C. 154(b) by 757 days.

(21) Appl. No.: 09/844,675

(22) Filed: Apr. 30, 2001

(65) Prior Publication Data

US 2002/0019962 A1 Feb. 14, 2002

Related U.S. Application Data

(60) Provisional application No. 60/200,500, filed on Apr. 28, 2000, and provisional application No. 60/205,468, filed on May 19, 2000.

(51) Int. Cl.$^7$ ............................................. G01R 31/28
(52) U.S. Cl. ...................... 714/724; 702/708; 702/112
(58) Field of Search ................. 714/724, 699, 714/738, 733, 734, 731, 726, 740, 744; 702/108, 124, 57, 70; 701/112; 324/76.11, 76.12, 76.77, 76.82, 76.83

(56) References Cited

U.S. PATENT DOCUMENTS

| | | | |
|---|---|---|---|
| 5,066,909 A | * 11/1991 | Firooz | 324/158.1 |
| 5,132,685 A | 7/1992 | DeWitt et al. | |
| 5,220,519 A | * 6/1993 | Eller | 702/116 |
| 5,481,471 A | 1/1996 | Naglestad et al. | |
| 5,568,493 A | 10/1996 | Morris | |
| 5,621,518 A | * 4/1997 | Beller | 356/73.1 |
| 5,646,521 A | * 7/1997 | Rosenthal et al. | 324/158.1 |
| 5,659,312 A | 8/1997 | Sunter et al. | |
| 5,748,124 A | * 5/1998 | Rosenthal et al. | 341/120 |
| 5,861,774 A | 1/1999 | Blumenthal | |
| 5,982,743 A | * 11/1999 | Kusano | 370/217 |
| 6,211,803 B1 | 4/2001 | Sunter | |
| 6,405,147 B1 | * 6/2002 | Fera | 702/112 |

FOREIGN PATENT DOCUMENTS

EP 0 923 196 A2 6/1999

OTHER PUBLICATIONS

A. Dancy and A. Chandrakasan, "A Reconfigurable Dual Output Low Power Digital PWM Power Converter", *Proc.IEEE International Symposium Low Power Electronics and Design*, pp. 191–196, Aug., 1998.

(Continued)

*Primary Examiner*—Phung My Chung
(74) *Attorney, Agent, or Firm*—Downs Rachlin Martin PLLC

(57) ABSTRACT

An integrated test core for mixed-signal circuits comprises a periodic waveform generator capable of generating arbitrary band-limited waveforms for excitation purposes and a waveform digitizer for extracting an arbitrary waveform from the test circuit's analog response signal. The digitized response may be tested and measured using DSP techniques. Preferably, the waveform generator and digitizer are synchronously controlled. The core is a nearly all digital implementation with the exception of a reconstruction filter (optional) for sending the test signal to the circuit under test (CUT) and the comparator for extracting the digitized waveform from the CUT's response. The periodic waveform generator may comprise a $\Sigma\Delta$ modulator and, optionally, a reconstruction filter between the modulator and CUT. The waveform digitizer may comprise a programmable reference voltage generator for providing a variable voltage reference signal, a comparator for generating a comparison signal from the CUT's analog response signal and the reference signal and means for controlling the reference voltage generator.

41 Claims, 19 Drawing Sheets

OTHER PUBLICATIONS

B. DuFort and G. W. Roberts, "Signal Generation Using Periodic Single and Multi-Bit Sigma-Delta Modulated Streams", *Proc.IEEE International Test Conference*, pp. 396–405, Washington, D.C., Nov., 1997.

S. D. Grigorescu, C. Iliescu and B. Pantelimon, "Sigma-Delta Modulation and PWM Performs High-Resolution DAC for DC Applications", *Conference on Precision Electromagnetic Measurements*, pp. 45–46, 1996.

A. Pierazzi, A. Boni and C. Morandi, "Band-Gap References for Near 1-V Operation in Standard CMOS Technology", *IEEE 2001 Custom Integrated Circuits Conference*, pp. 463–466, San Diego, CA, May, 2001.

G. A. Rincon-Mora and P. E. Allan, "A 1.1-V Current Mode and Piecewise-Linear Curvature-Corrected Bandgap Reference", *IEEE Journal of Solid-State Circuits*, vol. 33, #10, pp. 1551–1154, Oct. 1998.

M. M. Hafed, S. Laberge and G. W. Roberts, "A Robust Deep Submicron Programmable IDC Voltage Generator", *IEEE International Symposium on Circuits and Systems*, pp. IV-5–IV-8, May 28–31, 2000 Geneva Switzerland.

* cited by examiner

```
Sequence #1   1010011
Sequence #2            0100100
Sequence #3              0010010
Sequence #4                      1010010
Sequence #5                        1001010
Sequence #6                0110001
```

ΣΔ → 10100110001001010010011...

INTEGRATED EXCITATION/EXTRACTION SYSTEM FOR TEST AND MEASUREMENT

CROSS-REFERENCE TO RELATED APPLICATIONS

This application claims the benefit of U.S. Provisional Application No. 60/200,500 filed Apr. 28, 2000 and U.S. provisional Application No. 60/205,468 filed May 19, 2000.

MICROFICHE APPENDIX

Not applicable.

FIELD OF THE INVENTION

The present invention relates to analog test and measurement apparatus, more specifically, it relates to on-chip integrated excitation/extraction systems of analog test and measurement.

BACKGROUND OF THE INVENTION

The combination of an increased demand for consumer electronics and the continued growth in semiconductor packing density is driving towards the integration of more and more system functionality onto a single integrated circuit (IC). The result, among other things, is an increased need for the integration of analog and mixed-mode components (eg. analog-digital, RF-analog-digital, and mechanical-analog-digital) on the same chip as the digital components. Designing such mixed-signal systems-on-chip (SOCs) is distinctively challenging since it entails managing system level abstractions while simultaneously dealing with physical effects at the transistor and parasitic levels. In the same manner, testing next-generation SOCs represents a real challenge, especially since cost and time-to-market are usually key requirements. Such mixed-signal ICs contain complex signal paths and functional specifications, and post-design ad hoc test program development will no longer be viable since it can significantly slow down device characterization and debugging, and it can tie up automatic test equipment (ATE) resources (in the production phase) and greatly increase the time-to-market.

The difficulty is accentuated by another aspect of system-level integration, namely, the integration of third-party cores. In order to cope with design complexity, final system manufacturers are forced to rely on pre-designed blocks, or "cores," and to integrate these cores as part of the bigger, more complex systems. These cores are obtained from virtual library (software) descriptions of the final IC block. In the digital domain, test access mechanisms (e.g. through scan) and design-for-test (DfT) techniques are already in place for the most part, and test information (digital bits) can be transported without loss throughout the SOC and across the chip boundary to the outside world. Thus, it seems possible to derive a systematic procedure by which the final system integrator can access the embedded digital virtual cores. The problem in the analog domain is the fact that it is a Jot harder to "scan" signals over long distances in a chip and across the chip boundary to the outside world. Rapid signal degradation due to digital noise coupling or analog buffer distortion characteristics is very likely to occur.

In the present state of the art, analog and mixed-signal parts are tested externally for the most part. Even as core-based design grows in popularity, the most critical high-frequency analog cores are still allocated dedicated and handcrafted I/O access so that they can be tested to specifications using external instruments. This being said, recent attempts at integrating some test functionality have been made, although they remain to be ad-hoc and customized in nature. For example, with reference to FIG. 1, an on-chip ramp generator for the code-density testing of A/D converters known in the art is illustrated. However, this technique is very specific to a certain class of A/D converters. As well, a sine-wave generator using an oversampling delta-sigma oscillator has recently been proposed (FIG. 2a). To avoid the design complexity associated with such an oscillator, a circular memory based approach that approximates the output of a delta-sigma oscillator has been reported (FIG. 2b). This proposed design has the advantage of flexibility and the potential for a higher speed of operation. When both an A/D and a D/A converter are present, prior art assumes the A/D can be tested somehow (e.g. using the circular memory approach), and then the A/D is used to test the D/A (FIG. 3). Beyond A/D and D/A converters, other techniques use an analog test bus to matrix signals around the chip to boundary elements containing switches, buffers, and/or comparators.

As can be seen, the above approaches are limited customized solutions or are generally cumbersome to implement in a virtual core-based design environment. There is a need for a general integrated excitation/extraction system for analog test and measurement.

SUMMARY OF THE INVENTION

According to one aspect of the invention, there is provided a reliable and compact integrated test system for analog and mixed-mode circuits. It consists of an almost all-digital implementation, which means that it benefits from advances in digital design and test (e.g. automatic synthesis and layout, and easier verification). It is capable of generating waveforms (to excite the analog circuit under test) and coherently and synchronously digitizing periodic analog waveforms (to extract information about the circuit under test) while utilizing an area that is only equivalent to about five thousand standard cell gates. It is stand-alone, in the sense that it does not require the availability of any specialized on-chip structures, and it does not require external analog signals. Through programming in software, this system can perform curve tracing, oscilloscope, and spectrum analyzer functions, all in one embedded core.

According to a general aspect of the present invention, the on-chip integrated excitation/extraction system for analog test and measurement comprises a signal generator for generating a test signal to be sent to components of a circuit under test and a periodic waveform signal digitizer for analyzing a response signal from the components of the circuit under test. Preferably, the signal generator and the periodic waveform signal digitizer are synchronized using a single clock source. An analog reconstruction filter can be used to extract the analog signal for the CUT from the test signal bit sequence.

According to another aspect of the invention, a possible digital access mechanism is described, in which the integrated test/measurement system is transformed into a serial scan register. As such, a multitude of such integrated test systems can be integrated onto the same SOC in order to excite and measure a multitude of embedded cores, Since the core responses are digitized locally, their responses can subsequently be moved around the IC (through the digital scan paths) without loss of information.

According to a further aspect, a method for integrated excitation/extraction for test and measurement of a circuit under test is provided. In view of the above, it is the intent of this invention to provide a general test solution for analog cores that does not require the existence of A/D or D/A converters. It is another intent to provide a solution for the in situ digitization of the CUT response signals and transporting test information in the digital domain, rather than in real-time in the analog domain. It is further our intent to provide a multitude of these on-chip systems at various locations on an IC to measure analog effects at multiple locations on a chip.

Within the scope of this invention, the definition of an analog core encompasses a digital core that has to be measured to analog specifications. For example, digital signal rise/fall time or jitter are considered analog phenomena, as are digital signal coupling or digital switching noise.

BRIEF DESCRIPTION OF THE DRAWINGS

Further features and advantages of the present invention will become apparent from the following detailed description taken in combination with the appended drawings, in which;

FIGS. 9a and 9b illustrate the spectrum of a set of N consecutive $\Sigma\Delta$ outputs with a signal encoded at ~$F_S/4$, and a zoom showing the signal at 5 $F_S/4$, respectively;

FIG. 4 shows a flow-chart of the algorithm of FIG. 13;

DETAILED DESCRIPTION OF THE INVENTION

Figure 1:
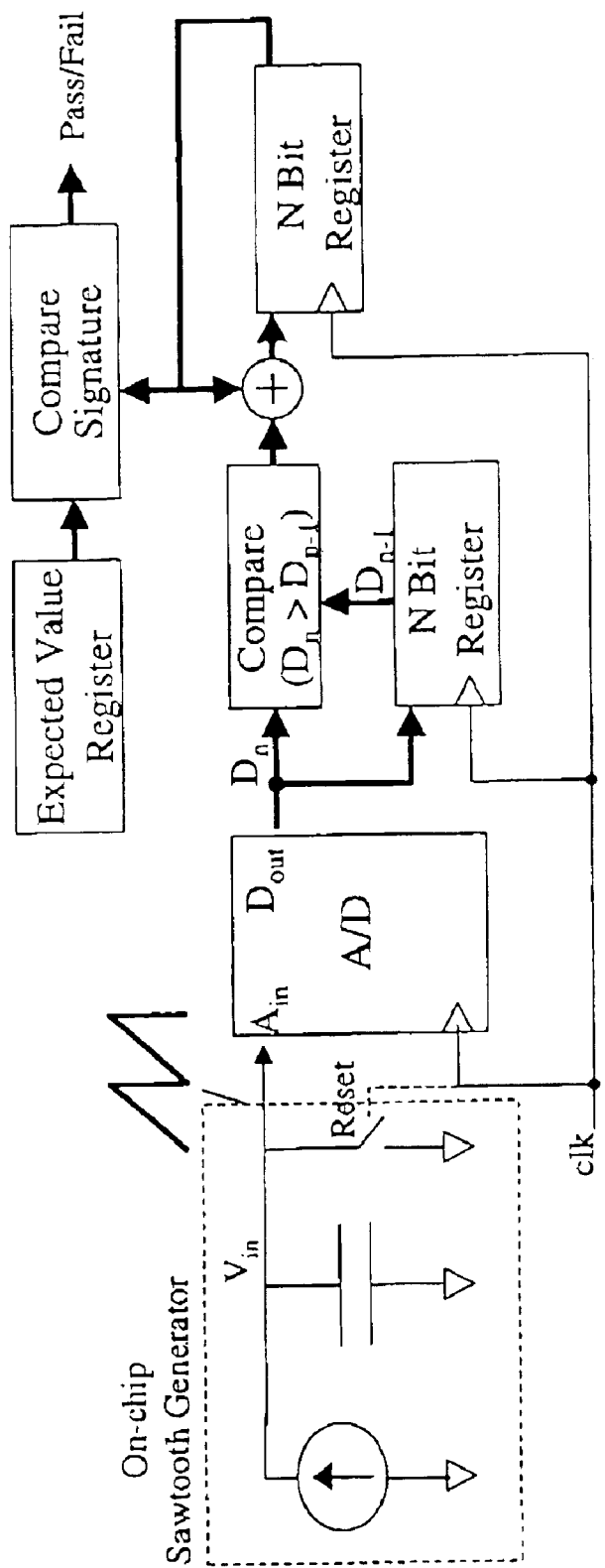
FIG. 1 (Prior Art) is a schematic block diagram of an on-chip ramp generator for the code-density testing of A/D converters.
Figure 2:
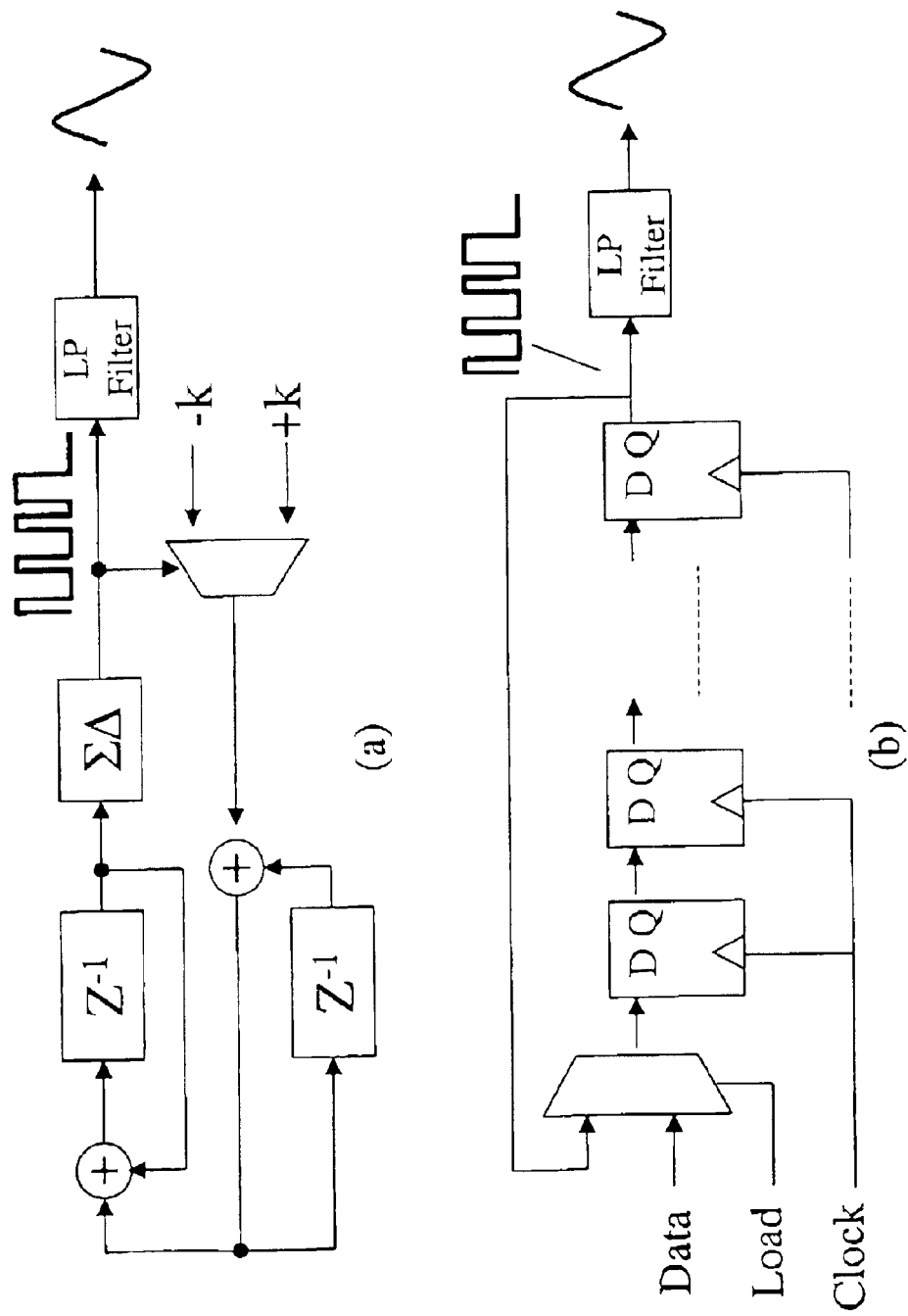
FIGS. 2a and 2b (Prior Art) illustrate schematically a sine-wave generator using a delta-sigma oscillator and a memory based approach to approximate the output of a delta-sigma oscillator respectively.
Figure 3:
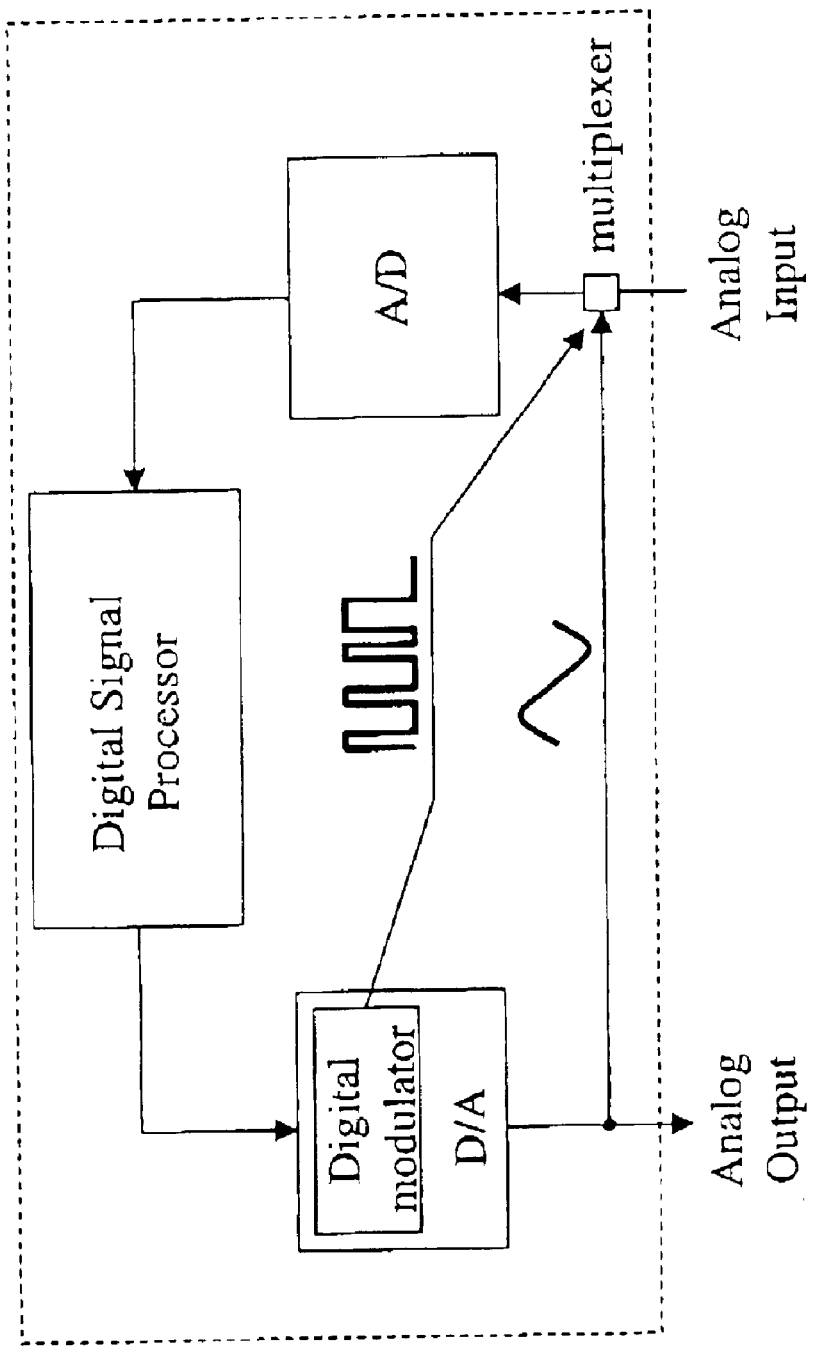
FIG. 3 (Prior Art) illustrates a test system for circuits having both an A/D converter and a D/A converter.
Figure 4:
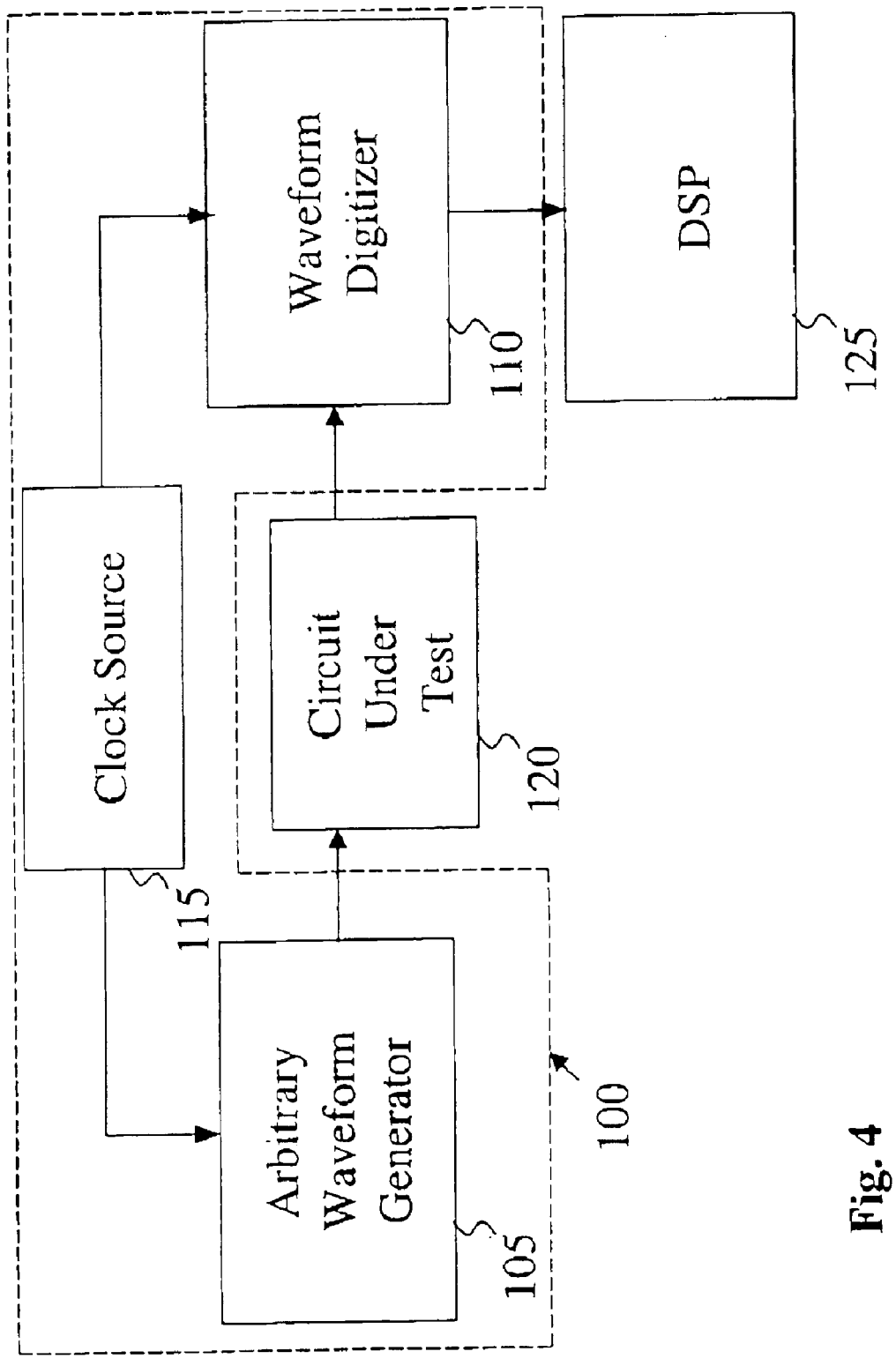
FIG. 4 shows functionally the components comprising the integrated excitation/extraction system for analog test and measurement of the present invention.

FIG. 4 shows a "functional" diagram of the proposed integrated excitation/extraction system for analog test and measurement. The system 100 comprises a means for generating arbitrary band-limited waveforms 105 and a means for synchronously digitizing 110 the periodic response of a circuits under test (CUT) 120. A simple clocking system 115 synchronizes the two means 105, 110. The output of the periodic waveform digitizer 110 is preferably stored in a digital memory 210 of FIG. 5 and may be connected to a digital signal processor (DSP) 125 that preferably resides on-chip for analyzing the digitized waveform. DSP 125 could be a general-purpose DSP that a system integrator is embedding in the final device, or it could be a specialized engine (like a Fast Fourier Transform computer or a digital filter), which could also be functional in the final product. A more detailed view of embedded test system 100 is shown in FIG. 5.

Figure 5:
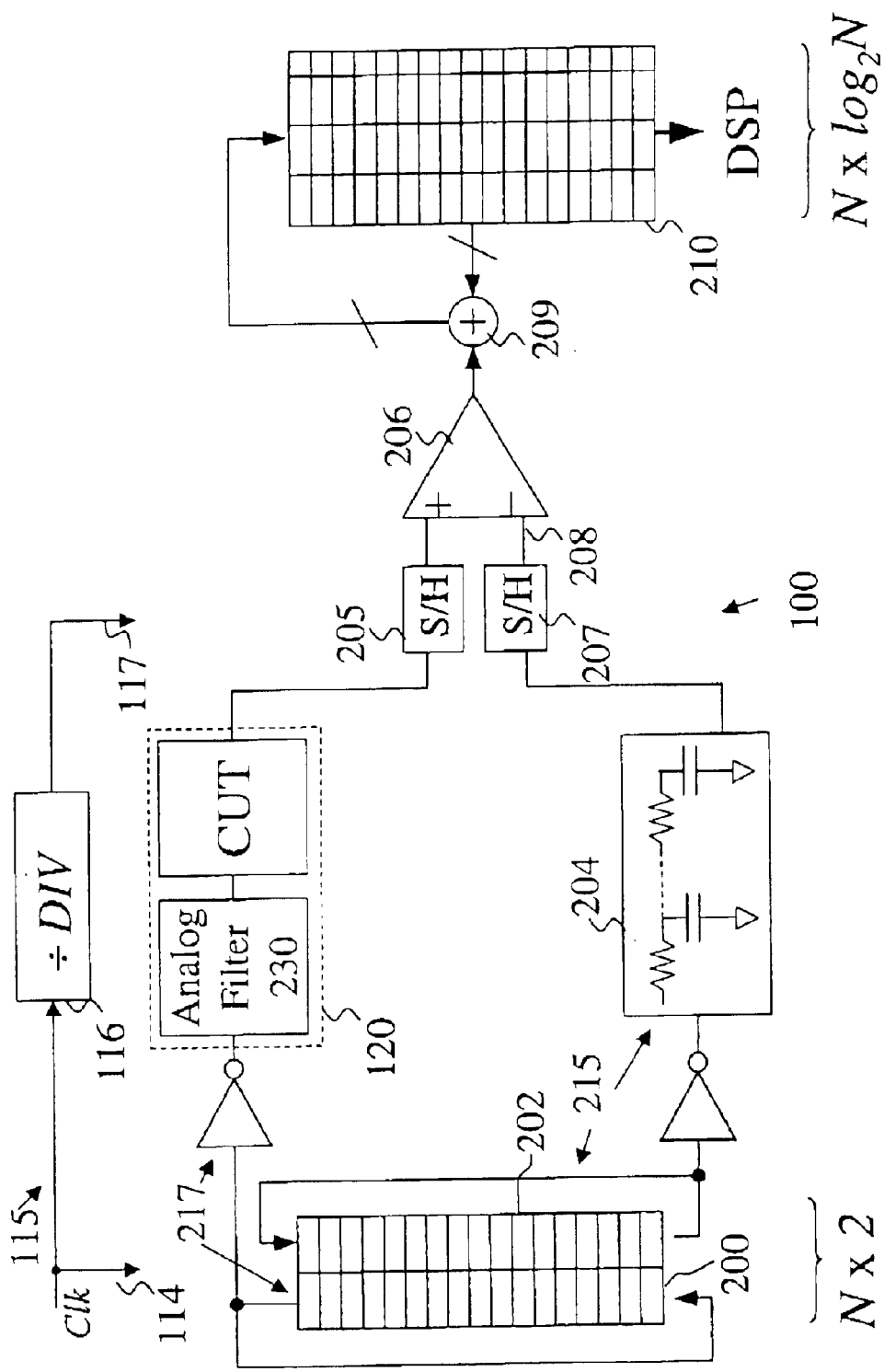
FIG. 5 shows a more detailed view of the invention of FIG. 4.

With reference to FIG. 5, system 100 preferably comprises first and second one-bit memory periodic bit-stream generators 217, 215 preferably implemented as sequential shift registers as will be described further below, analog structures 204, 206, and 209 and a multi-bit memory 210 for output data storage (parts of which memory could be implemented externally to the device). A key feature of this architecture is its simplicity and modularity. First and second one-bit memory 200, 202 implement two periodic bit stream generators 217 and 215. First one-bit memory 200 provides arbitrary AC signal generation for exciting CUT 120 while second one-bit memory 202 provides DC signal generation. As was described earlier, a short bit sequence can be chosen to encode a high-quality periodic analog signal (e.g. a sine wave). When this sequence is periodically repeated and passed through a relatively imprecise analog reconstruction filter 230, a high quality analog signal can be generated. Thus, first one-bit memory 202 is used to synthesize periodic analog signals in accordance with this technique.

Second one-bit memory 202 is used with averaging circuit 204 to encode high-precision DC levels that sweep the whole range of the device supply voltages. These DC voltages are combined by an analog comparator 206 to perform arbitrary amplitude resolution digitization. An algorithmic progressive A/D conversion operation that relies on the periodicity of the CUT response signal is utilized and described further below with reference to FIGS. 13–15.

FIG. 5 also shows a straightforward implementation of the clocking system 115. For reasons that will be apparent later, first and second one-bit memory 200, 202 are expected to run at or close to the maximum speed of the technology, but the same cannot be said about comparator 206 (and hence the output memory 210). In a preferred implementation, clocking system 115 implements a frequency divider 116 to slow down the incoming samples to comparator 206, while not compromising the effective sample rate of digitizer 110.

Periodic Bit Stream Generators

Figure 6:
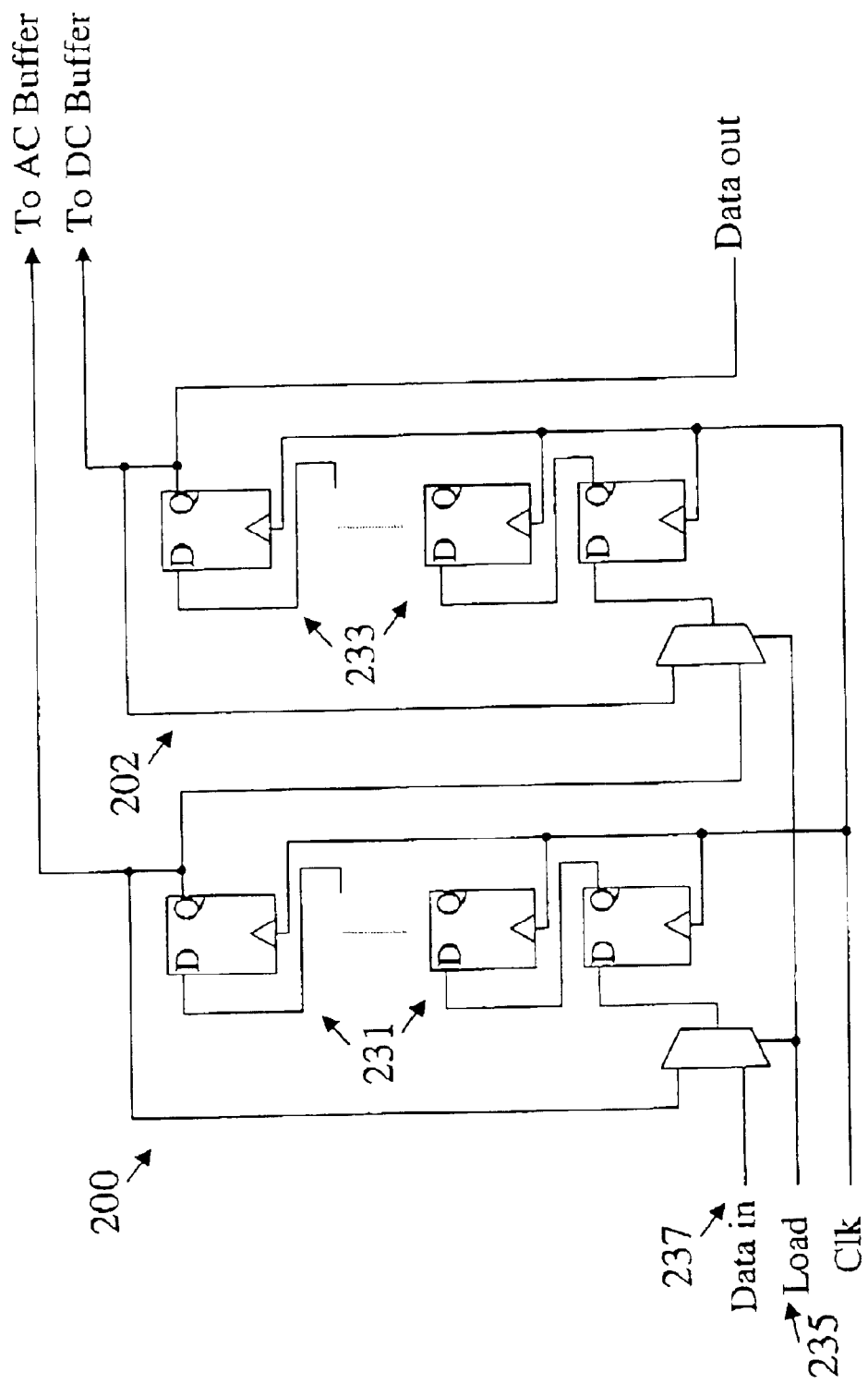
FIG. 6 shows a preferred implementation of signal generation components of the present invention of FIG. 5.

In monolithic form, the periodic bit stream generators 217, 215 (comprising respectively first and second one-bit memories 202, 204) can simply be implemented in the manner shown in FIG. 6. In this figure, daisy-chained D Flip Flops 231, 233 are used and a control signal 235 determines whether to serially load the chains from data input 237 or to periodically circulate their contents. Both memories 200, 202 may be loaded through the same input port 237 through a simple multiplexing mechanism. This implementation is attractive because it is extremely easy to synthesize and can benefit from very high speeds of operation. The D Flip Flops 231, 233 should be optimized for speed and low power dissipation. It should be noted, however, that many forms of embedded digital "memory" could be used to perform the periodic circulation of digital bits.

Encoding an AC Signal

A short bit sequence may be chosen to approximate the output of a one-bit sigma-delta (ΣΔ) modulator when driven by a periodic signal. The concept behind this approach is described in the art and an application entitled "Programmable DC Voltage Generator" assigned to the owner herein and incorporated herein by reference and the concept consists of simulating a high-order noise shaping modulator and capturing a finite duration (finite number of samples) of its output. Periodically repeating this finite segment approximates the usually chaotic output of the ΣΔ modulator. However, in order for the periodic approximation to achieve a high fidelity, the frequency of the input signal to the ΣΔ modulator has to be harmonically related to the fundamental frequency of the bit sequence: if N is the length of the approximate ΣΔ sequence and $F_S$ is the sampling rate, then, the input to the modulator has to be a multiple of $F_S/N$. In fact, the forced periodicity of the approximate ΣΔ output also means that the encoded signal contains only multiples of this same fundamental frequency:

$$f_{out} = \frac{M}{N} F_S, M = 0, 1, 2, \Lambda, \frac{N}{2} \quad (1)$$

Figure 7:
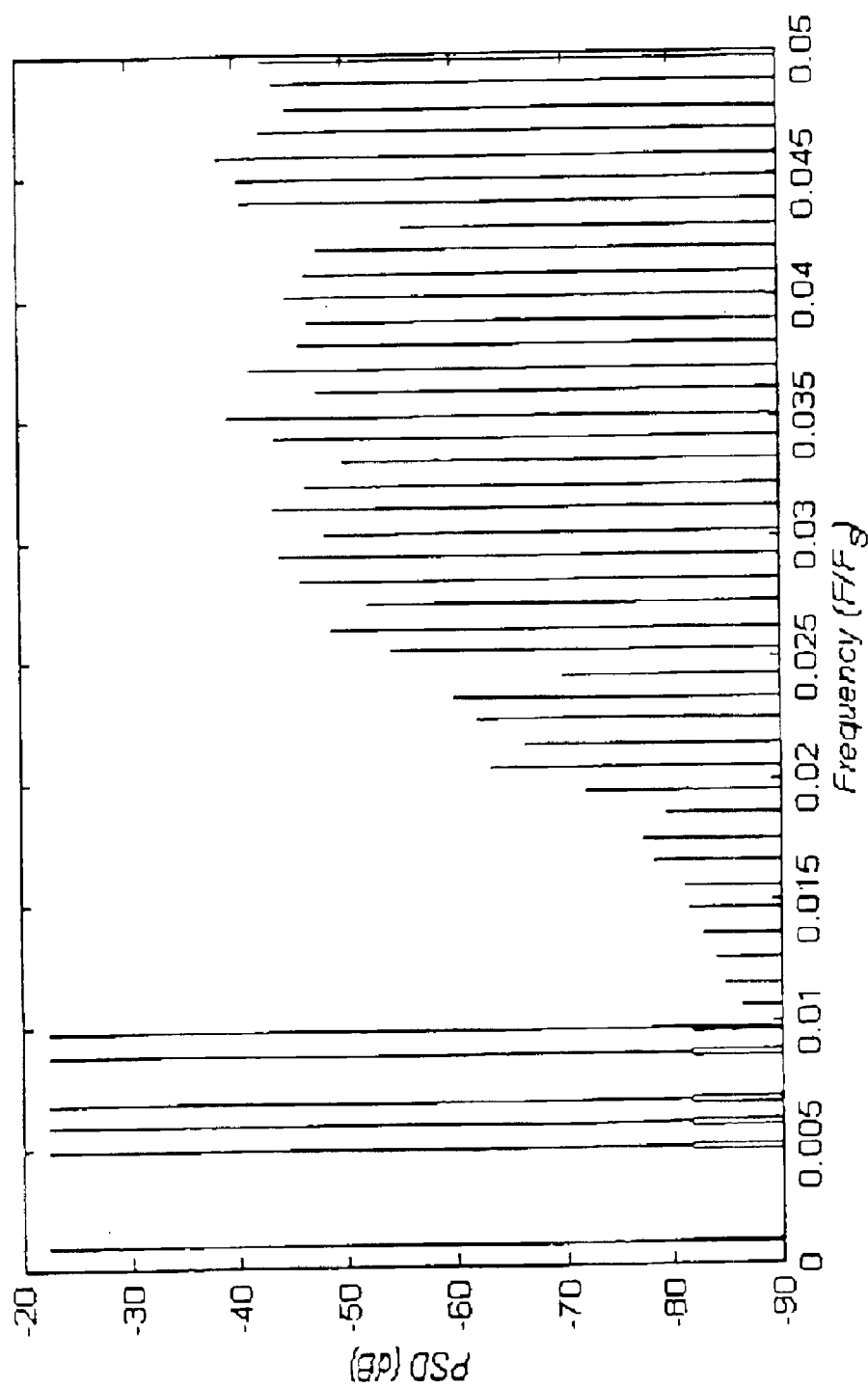
FIG. 7 shows the power spectral density (PSD) of a typical finite-length approximation to a $\Sigma\Delta$ output.

This is a very important feature of the bit stream generator that makes it favorable over other signal generation techniques, described earlier. Specifically, it guarantees sample coherence with our on-chip circuit-response digitizer. Coherent sampling enables the use of a small number of samples in a DSP-based measurement environment. FIG. 7 shows the power spectral density (PSD) of a periodic ΣΔ stream. As can be seen, as long as the encoded signal lies within the modulator bandwidth, it will have very low distortion harmonics. The encoded signal in this case is a multi-tone signal, which is typically used for frequency response measurements.

Figure 8:
FIG. 8 illustrates sampling a $\Sigma\Delta$ modulation.

It is important to note that randomly choosing a set of N consecutive outputs of the ΣΔ modulator does not generally produce a signal having the high quality that is depicted in FIG. 7. The reason is that, as discussed above, the output of a ΣΔ modulator is generally a periodic even if its input is periodic. Consequently, only an infinitely long sequence of bits is expected to approach the true ΣΔ modulator output's dynamic range and noise-shaping properties. Instead, some form of optimization is needed in the choice of the NΣΔ outputs. Selecting an optimum bit stream has been described earlier in the literature and is thus beyond the scope of this patent. In a nutshell, and with reference to FIG. 8, the ΣΔ modulator is simulated for a very long time duration and sets of N consecutive bits are captured and analyzed. The algorithm continues to select different sequences (of length N) until the desired spectral properties are achieved.

Figure 9:
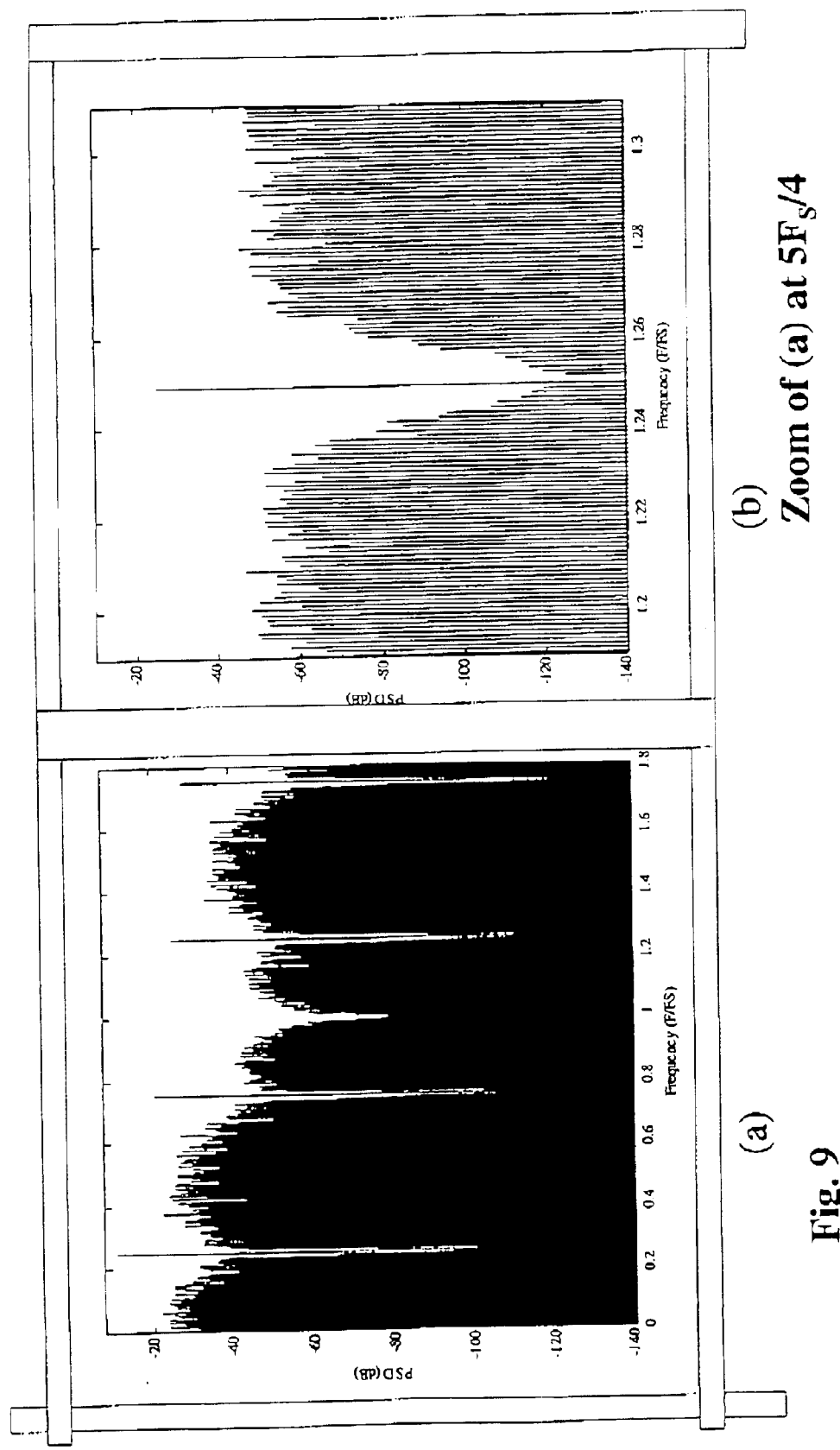
FIG. 9. shows test signal sub-sampling without modifying frequency content.

In the prior art, the periodic bit stream has been used to generate signals that are located within the Nyquist rate of $F_S/2$. In this application, since the on-chip digitizer has the potential of capturing much higher test bandwidths, there is an option of using the signal images that arise in the frequency domain as a result of periodically repeating the bit sequence. Specifically, the spectrum of the periodic signals generated using this method will have copies at multiples of $F_S$, although the energy levels at increasing frequencies keep decreasing and eventually, they cannot be resolved from the thermal noise. FIG. 9 shows an example where a signal that is encoded at approximately $F_S/4$ using the above technique also appears at about $5F_S/4$ and $7F_S/4$. Provided these tones can be filtered and detected by the circuit under test, the on-chip digitizer can also be used to capture responses at these frequencies.

Encoding a DC Signal

As will be described shortly, arbitrary precision digitization is achieved using only a single analog comparator 206 with varying values of the reference input 208 to the comparator 206. These DC reference levels need to be generated accurately over the whole range of input amplitudes, since their linearity directly influences the overall linearity of the complete capture system. To achieve these requirements, digital pulse modulation techniques are used, in which the desired DC level is encoded in the average of a periodic digital sequence. This has the advantage of an almost guaranteed linearity (assuming the digital electronics function properly).

Figure 10:
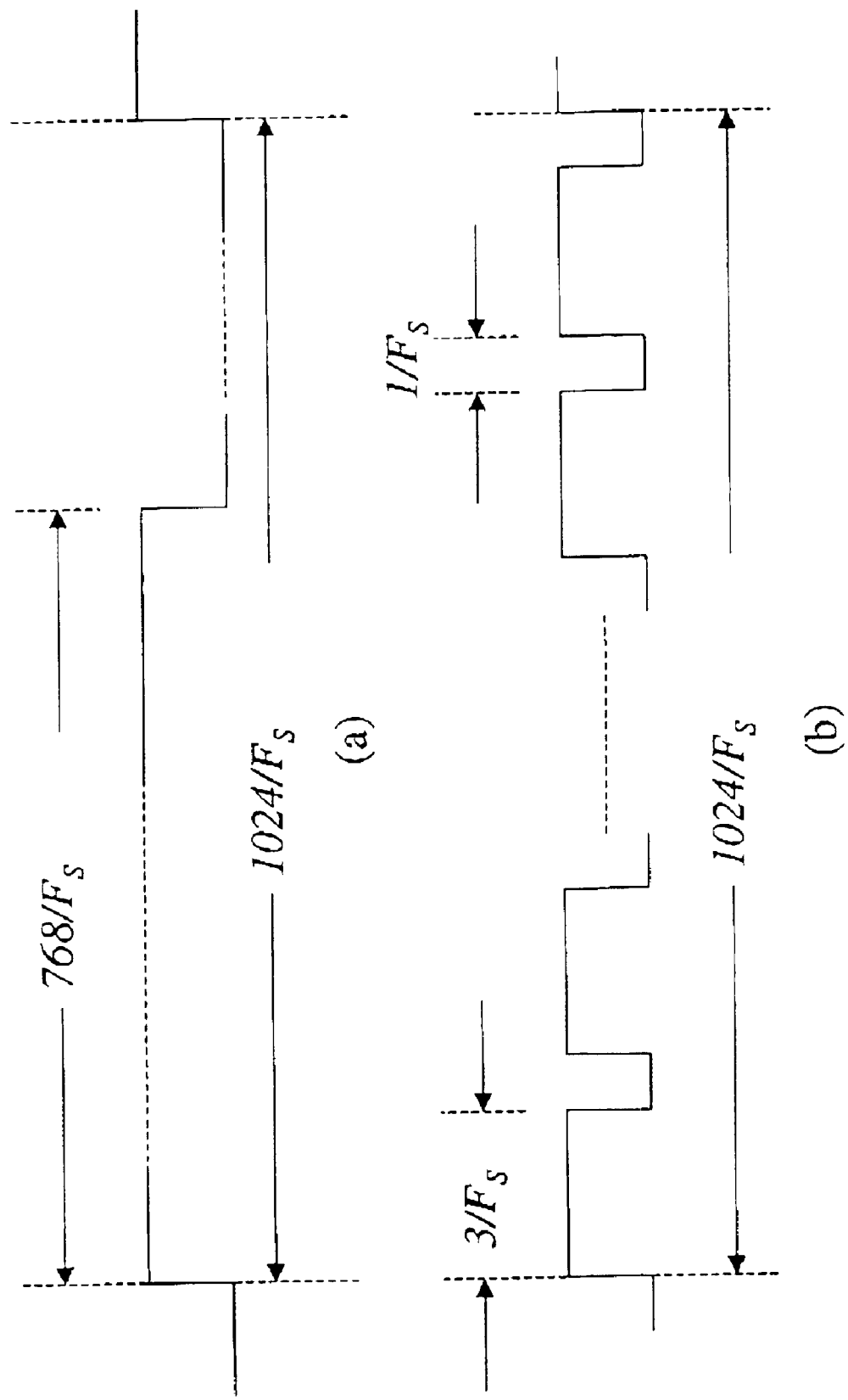
FIGS. 10a and 10b show two signal encoding schemes.

The encoding scheme for the reference level is pulse-density modulation, which also relies on over-sampling, noise-shaping principles. The main reason for this is to combat the shortfalls of traditional parallel-serial conversion techniques that possess high linearity for low-cost DC (low frequency) D/A converters like pulse-width modulation (PWM). Pulse-width modulation has poor spectral properties, which renders it impractical in an application like this one. For example, the rectangular waveform of FIG. 10(a), which encodes a DC level of 0.75 $V_{DD}$, and whose Fourier Series can be expressed as $$x(t) = \frac{768}{1024} V_{DD} + V_{DD} \sum_{k \neq 0} \frac{1}{k\pi} \sin\left(\frac{768}{1024} k\pi\right) e^{jk \frac{2\pi F_S}{1024} t}, \quad (2)$$

has most of its harmonic energy concentrated at a frequency of $F_S/1024$, a very low frequency. A filter that sufficiently attenuates this harmonic energy will need to have a rather big time-constant, and the latter has to increase as the number of encoded levels, $N_B$, increases. With ΣΔ modulated streams, which are conceptually illustrated in FIG. 10(b), we can encode the same DC levels while benefiting greatly from the frequency characteristics of pulse-density modulation (PDM). For example, the Fourier Series representation of the signal of FIG. 10(b) is given by $$x(t) = \frac{3}{4} V_{DD} + V_{DD} \sum_{k \neq 0} \frac{1}{k\pi} \sin\left(\frac{3}{4} k\pi\right) e^{jk \frac{2\pi F_S}{4} t} \quad (3)$$

where the dominant harmonic now sits at a frequency of $F_S/4$, a much higher frequency. A low-pass filter that attenuates this harmonic to the required ripple magnitude will have a much smaller time-constant (hence smaller implementation area) than one that would be used in the case of PWM sequences. In general, ΣΔ representations of arbitrary DC signals will still contain harmonics at $F_S/N_B$. However, noise shaping properties of software ΣΔ modulators ensure that these will be low enough in power so as not to dominate the design of the averaging circuit 204 (e.g. a low-pass filter).

Analog Filtering

Figure 11:
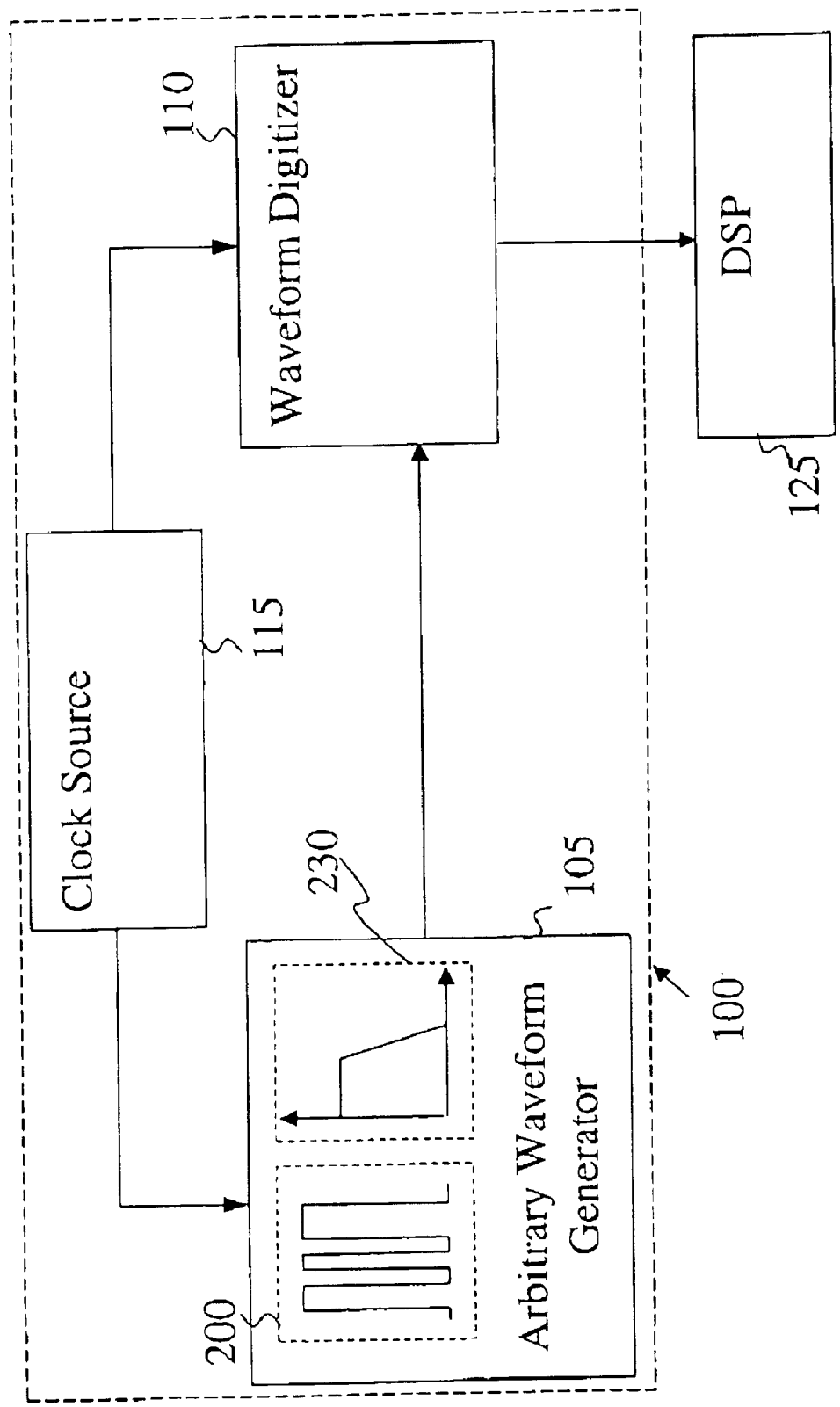
FIG. 11 illustrates the invention of FIG. 4 in a "self-test mode" where the output of the signal generator is directly connected to the signal digitizer.

Two analog averaging or filtering operations are performed, one for the AC generator 200, and one for the DC generator 202. Concerning the first one bit memory 200, a filter is generally required to reconstruct the analog signal, and the type of filter will ultimately depend on the application of interest. In some applications, the filter is part of the CUT 120 as illustrated in FIG. 5. For example, the CUT might itself be a filter (low pass or band pass), or it might perform a more complex function that is preceded by a filtering operation. If no filter is present, then a relatively imprecise filter has to be included. The design of the filter is facilitated by the noise-shaping properties of ΣΔ modulation, which means that the filter needs only be tuned to the pass-band of the ΣΔ stream, regardless of the encoded analog signal. More importantly, since AC bit stream generator 200 is fully programmable, the architecture of the present invention is not restricted to a particular modulator order or topology. Thus, the spectral properties of the programmable ΣΔ streams can be shaped in such a manner that compensates for the roll-off behavior of the implemented filter within the desired test-system bandwidth. Specifically, the implemented filter response can be measured using integrated capture system 100 and then compensated for in the bit stream generation phase. Consider a situation in which the test system is connected in the manner shown in FIG. 11, where the output of reconstruction filter 230 is directly connected to waveform digitizer 110. In this configuration, a multi-tone signal whose frequency content is chosen to match the frequency response of filter 230 is encoded by periodic bit stream generator 200. The stream is passed through filter 230 and the resulting waveform is captured using the on-chip waveform digitizer 110. A FFT-based analysis can then be used to characterize filter 230. Other types of tests can also be performed on filter 230 before overall test system 100 can be used to verify the other integrated analog circuits. For example, a model of the non-linearity introduced by arbitrary waveform generator 105 can be created, and its effects can be cancelled in software when, say, the non-linearity of the circuit under test 120 is being verified.

Figure 12:
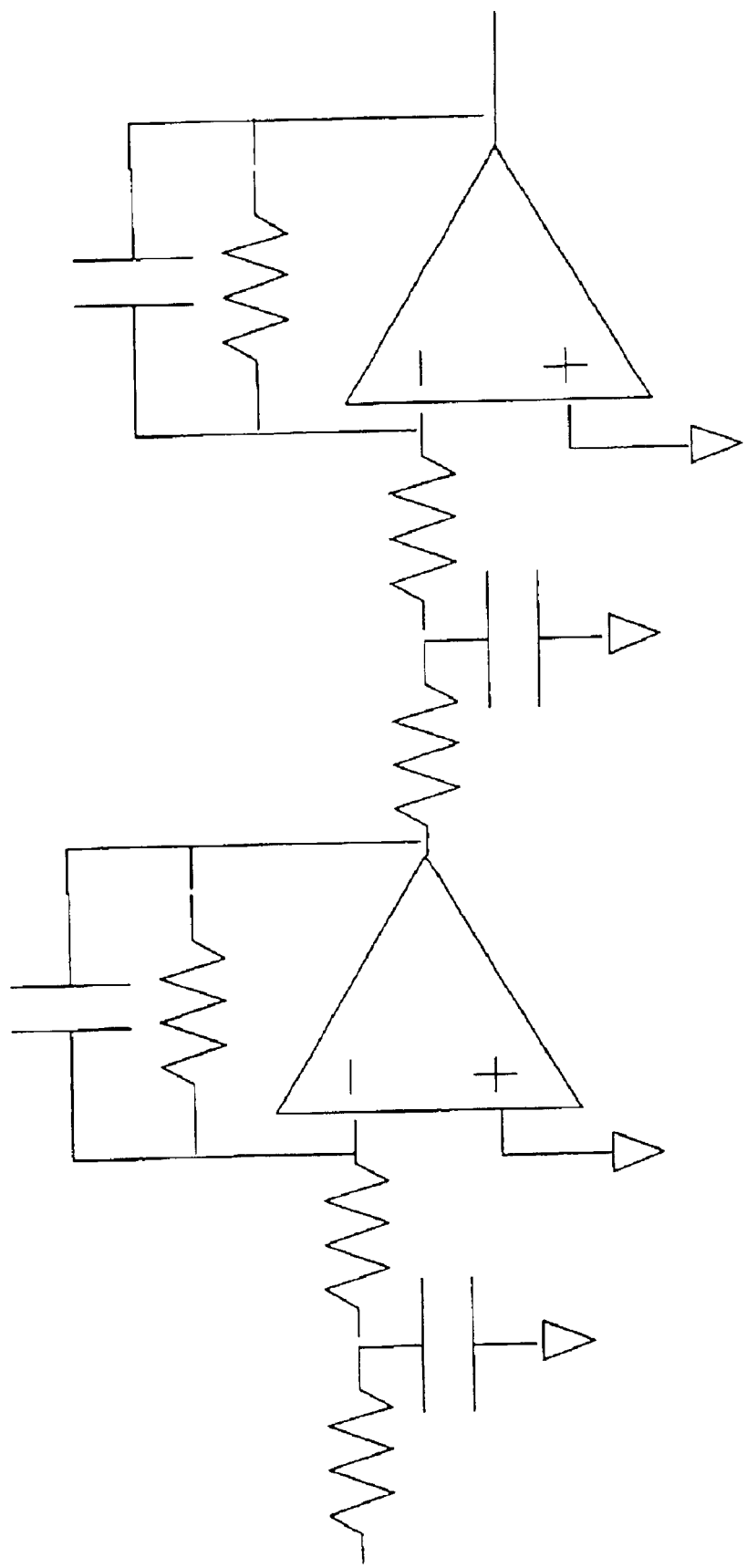
FIG. 12 shows an exemplary analog reconstruction filter.

Preferably, analog reconstruction filter 230 is an active RC filter. This type of filter has the advantage of providing very good linearity and dynamic range and meets the attenuation specifications for ΣΔ-encoded bit streams. Moreover, it is relatively easy to integrate in monolithic form. FIG. 12 shows a single-ended example of a $4^{th}$-order low-pass filter, although a $4^{th}$-order filter is not required. As was mentioned earlier, the final filter requirements will ultimately be dictated by the application. In other words, there is a compromise between the noise-shaping properties of the generated ΣΔ bit streams, and the roll-off requirements of analog reconstruction filter 205. Moreover, the fact that the roll-off behavior of filter 205 may be measured means less stringent requirements on the filter transition band can be tolerated, without significantly compromising the usable bandwidth for test tone generation.

As for the DC generator 202, the average of the periodic bit stream is extracted using only a passive RC filter. The reason is that such a filter yields the DC component of the input signal with maximum accuracy, which is key to achieving robustness to process variation. An examination of the transfer function for the first order case reveals that the gain at DC is unity regardless of the value of RC:

$$|H(f)| = \frac{1}{\sqrt{1 + (2\pi fRC)^2}} \quad (4)$$

In practice, higher order filters are desirable since they have the potential of achieving a smaller time-constant for the same ripple requirements (i.e. bandwidth). A passive RC filter is also compact and benefits directly from scaling as the modulation frequency increases with process improvements. In fact, the filter response of (4) and, similarly, the filter response for the AC generator are the main reasons why first and second one-bit memories 200, 202 of FIG. 5 are preferably circulated at the maximum speed of the technology. A faster clock rate means higher frequency signals and hence smaller filter implementation areas and faster settling times. Running at the maximum speed of the technology is possible since there are no logic elements between the Flip Flops 231, 233 in FIG. 6. For example, it is not unreasonable to achieve a rate of 1 GHz in a 0.25 μm standard digital CMOS process.

Integrated Circuit Response Capture

The combination of comparator 206 and the DC bit stream via input 208 enables us to achieve arbitrary analog waveform digitization. The periodicity of the analog signal under test (which is enforced in the present architecture) enables one to make multiple comparison passes over progressive periods of this signal.

Figure 13:
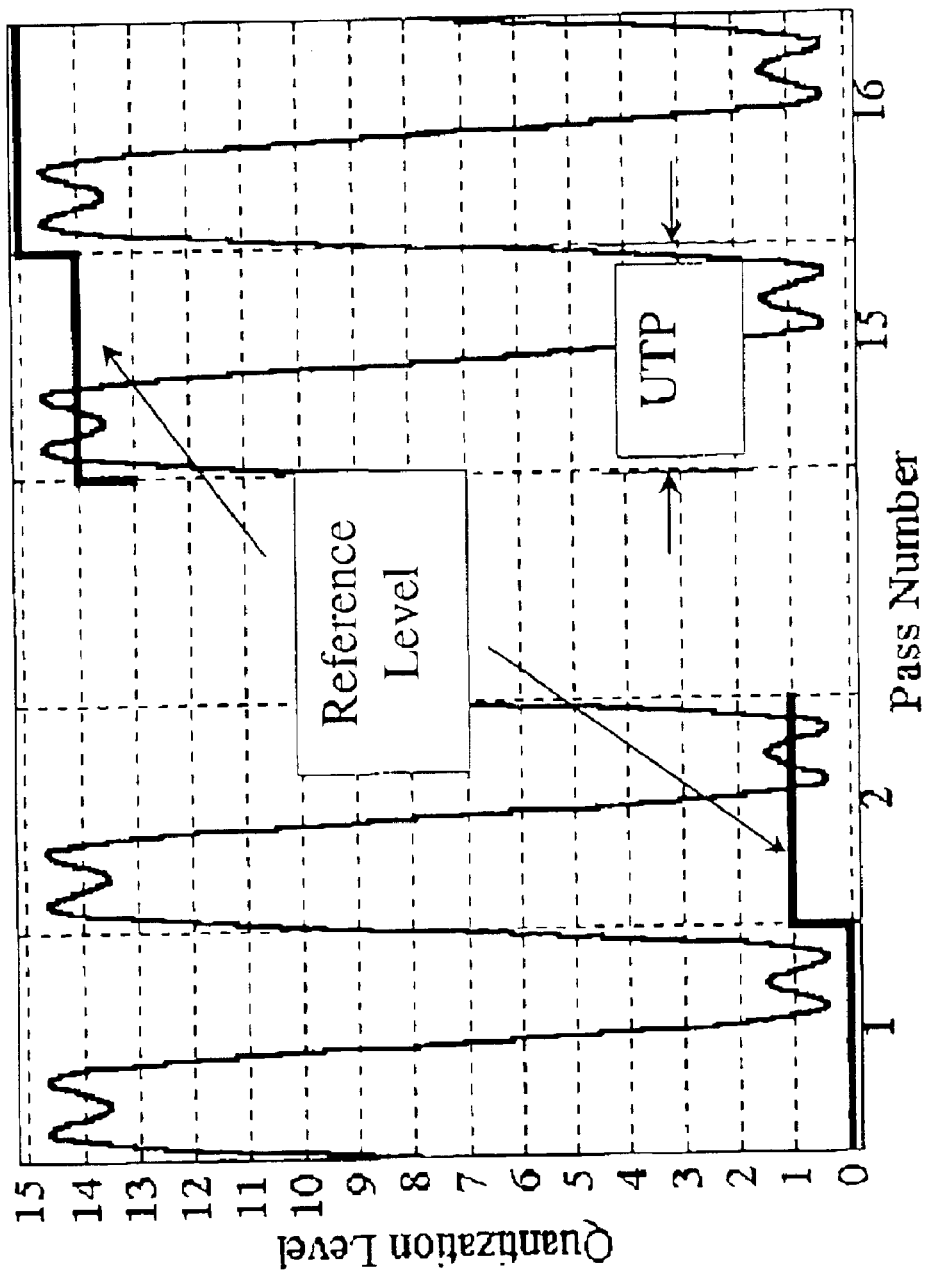
FIG. 13 illustrates graphically a multiple-pass digitization comparison algorithm.
Figure 14:
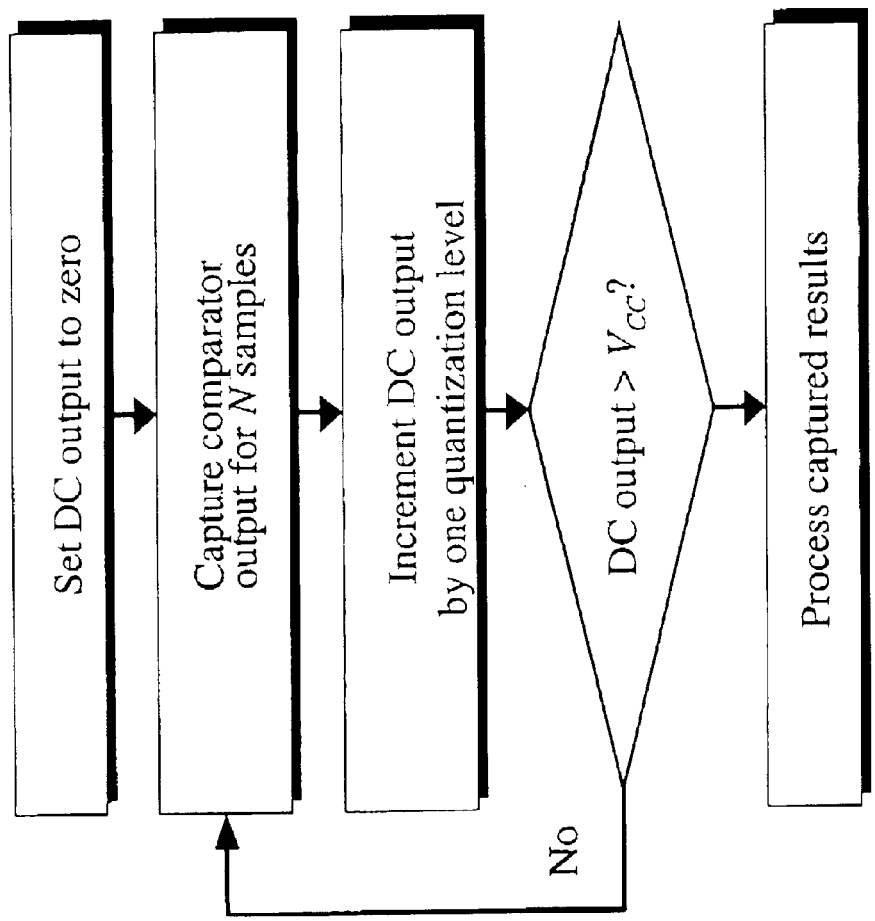
Figure 15:
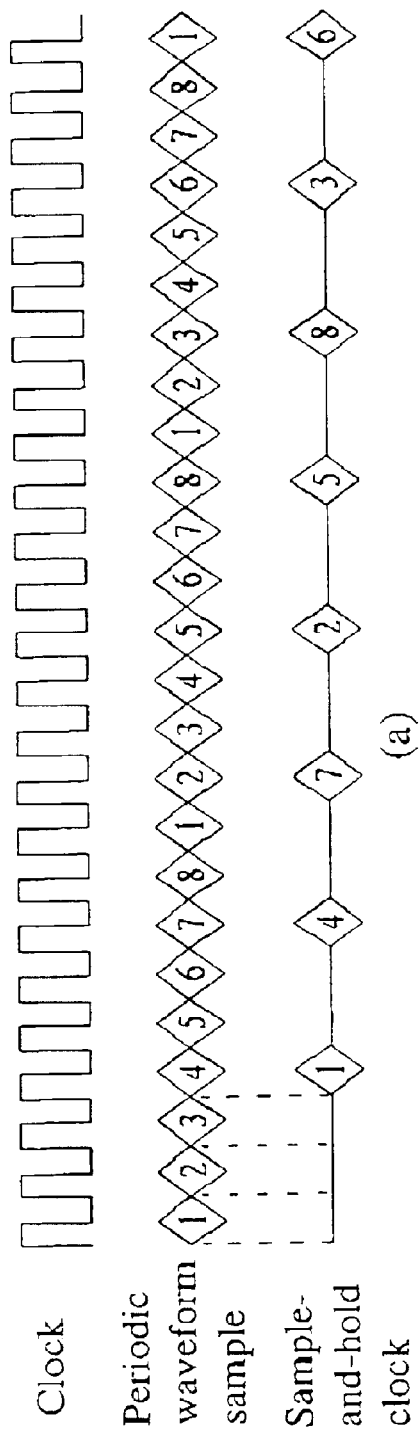
FIG. 15 graphically illustrates clocking to reduce incoming sample speed.
Figure 15:
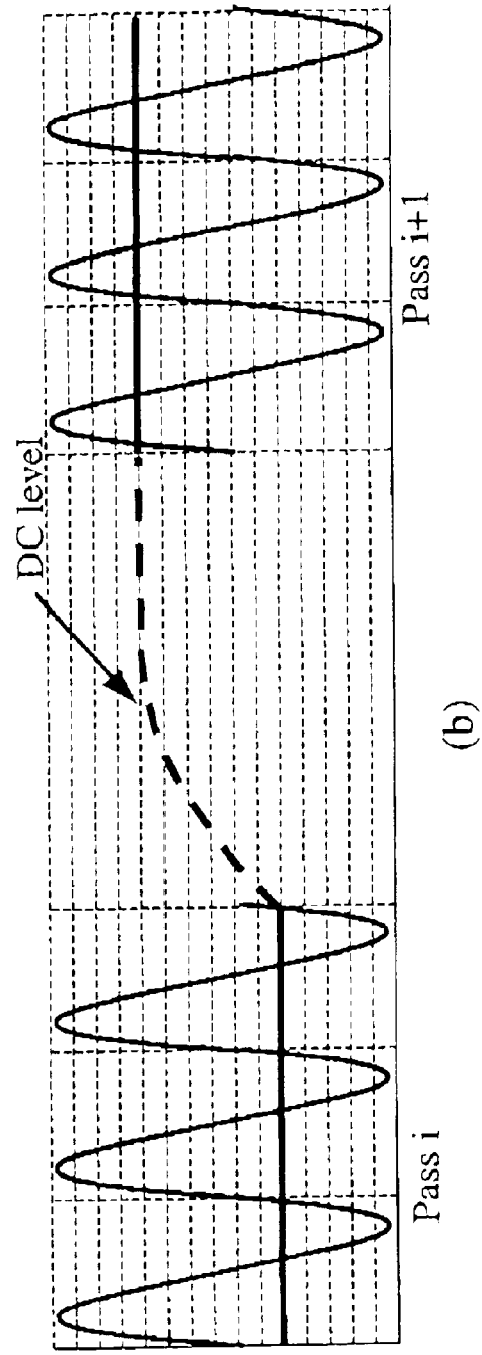

The way the signal is digitized is as follows. Assume that the number of samples in the unit test period is N, and the number of quantization levels in the overall A/D conversion operation is $2^M$ (according to FIG. 5, this is also equal to N). First, programmable reference voltage generator 215 is commanded to output the lowest possible quantization level. All samples of the unit test period are collected and compared to this quantization level. Once all comparisons are made (stored in memory), reference voltage generator 215 is commanded to increment its output to the next quantization level, and the process repeats. Specifically, since the analog waveform to be digitized is periodic, the quantization level can be incremented and sampling delayed for as long as desired before collecting new samples for comparison (as long as the start of the new comparison pass is at the same location on the unit test period). FIG. 13 illustrates this multiple-pass comparison algorithm graphically, and FIG. 14 shows a flowchart of this procedure As can be seen in FIG. 13, since the waveform is to be quantized using 16 levels, the conversion process covers 16 cycles of the waveform. In each cycle, all N waveform samples are compared to the respective quantization level. Realistically, however, the programmable reference voltage level cannot be incremented instantaneously. So, after each comparison pass, at least one waveform cycle has to pass (in order to allow the output level to settle to its final value) before the next comparison pass can be performed.

As can be seen, our capture algorithm relies primarily on the proper synchronization with the excitation system. Specifically, in each comparison pass, the comparator is expected to see the exact same samples of the test signal as it did in the previous passes. This is easily achieved using the bit stream generation approach, since all the generated tones are well defined with respect to the sampling clock system 115.

Similarly, the clock speed that the periodic bit stream generators 200, 202 run at is generally faster than the comparison speed of typical integrated voltage comparators (e.g. 206). Under these circumstances, a sample-and-hold circuit 205 (which can track and sample very fast signals) can be inserted at the corresponding input of comparator 206 to receive the signal from circuit under test 120. Sample-and-hold circuit 205 introduces a means for sub-sampling at another level for each quantization level as demonstrated graphically in FIG. 15a and FIG. 15b. In this figure, comparator 206 is assumed to take as many as three clock cycles to arrive at a decision about the relative magnitudes of its two input signals. To accommodate comparator 206 while still achieving a high effective sampling rate, sample-and-hold circuit 205 can be clocked in the manner shown in FIG. 15a. In this example, if the periodic input signal is allowed to cycle three times, all samples of this period will be collected. So, in effect, each comparison pass in FIG. 13 will now take three unit test periods instead of just one. In general, with additional reference to FIG. 5, the ratio of the bit stream clock 114 and the comparator clock 117 has to be a prime relative to the total number of samples in a test period, N, which is the same as the requirement for coherent sampling (described further below). For example, in FIG. 15 (since N is a power of 2), the comparator can take 5 or (7) clock cycles to arrive at a comparison decision, but 5 (or 7) periods of the input signal have to complete over each comparison pass.

It should be noted that the means for sub-sampling in this application also encompasses a passive sampling network (consisting only of switches and capacitors) at the front-end of a comparator. Full-featured sample-and-hold circuits (e.g. with input and output buffers or feedback loops) are not needed in such a case since output of the sample-and-hold is fed directly to a comparator at a well-defined time instant. In some occasions, fast sample-and-hold circuits (even passive ones) can exhibit a small amount of non-linearity that might affect the linearity of the complete measurement system. To avoid this, another means for sub-sampling (e.g. sample-and-hold circuit 207) is placed at the negative input 208 of the comparator 206. This way, the two paths at the input of comparator 206 are identical (assuming matched devices and boundary conditions). Provided that sample-and-hold circuits 205 and 207 are monotonic, the difference voltage between the two inputs of comparator 206 is not expected to change polarity due to non-linearity of the sample-and-hold circuits 205, 207.

Processing of the comparator output is done using a multi-bit memory 210 (FIG. 5) that is preferably the same length as the length of the unit test period and that is initialized to zero at the beginning of a measurement run. For each comparison pass, the bit stream generators 217, 215 continuously circulate their contents to output the analog stimulus and the reference level, respectively. For each circuit response sample, the corresponding memory location is incremented or left unchanged, depending on whether the comparator output (for the current DC level) was 1 or 0. Thus, the adder 209 in FIG. 5 is just an increment-by-one structure that increments the memory location depending on the comparator output. At the end of the digitization process, each memory location contains an integer count representing the quantization level for the corresponding sample (i.e. a thermometer code). Alternatively, the output memory 210 can have a width of 1 bit, and the increment operation can be performed externally to the chip.

Clocking System

As was mentioned earlier, in its simplest form, synchronous control clocking system 115 provides a simple integer frequency divider 116 (which can be implemented as a counter) in order to accommodate the lower speed of the on-chip voltage comparator. Integer divider 116 is chosen to set the comparator sampling rate in such a way that enables the digitization of the input test signal where all N samples appear to have been taken at evenly distributed times over one cycle of the test signal. To that end, the conditions for coherent sampling, have to be satisfied. Specifically, N, the number of samples in the periodic test signal (determined by the bit stream lengths on the stimulus side) should be relatively prime with respect to DIV, the clock division ratio. FIG. 15a already illustrated the example of N=8 and DIV=3. Again, recall that the test signal is now circulated DIV times in order for all N samples to be stored. It should also be noted that this configuration allows for sampling signals at multiples of $F_S/N$ (refer to equation 1) even if these extend well beyond $F_S$ (as is the case when images of the bit stream spectra are used). In other words, the effective bandwidth of the system is determined by the tracking bandwidth of the comparator input sampling network (e.g. sample-and-hold 205) and not by the division ratio, DIV.

Some high-speed circuit phenomena occur at a periodicity that is associated with the overall system clock (e.g. digital switching noise in the power, supply rails or in the substrate) and/or are broadband in nature. In such applications, an integer DIV does not suffice since phenomena at multiples of $F_S$ create an ambiguity when aliased back to the Nyquist interval (baseband); and since aliasing masks signal information in the case of broadband signals. A fractional frequency divider can be used for the sampling clock in order to provide for a much finer sampling resolution, but it is relatively hard to implement in monolithic form. Alternatively, digitizer sampling control 117 can be provided externally, so that test system 100 expects two clock frequency inputs (not shown). In this case, the periodic bit stream generators are circulated to perform a synchronization function to periodically trigger the on-chip event being measured, and the digitizer clock is used to sample the CUT response and progressively digitize it (over multiple runs) at a multitude of time instants within the synchronization clock period.

Access Mechanism

Figure 16:
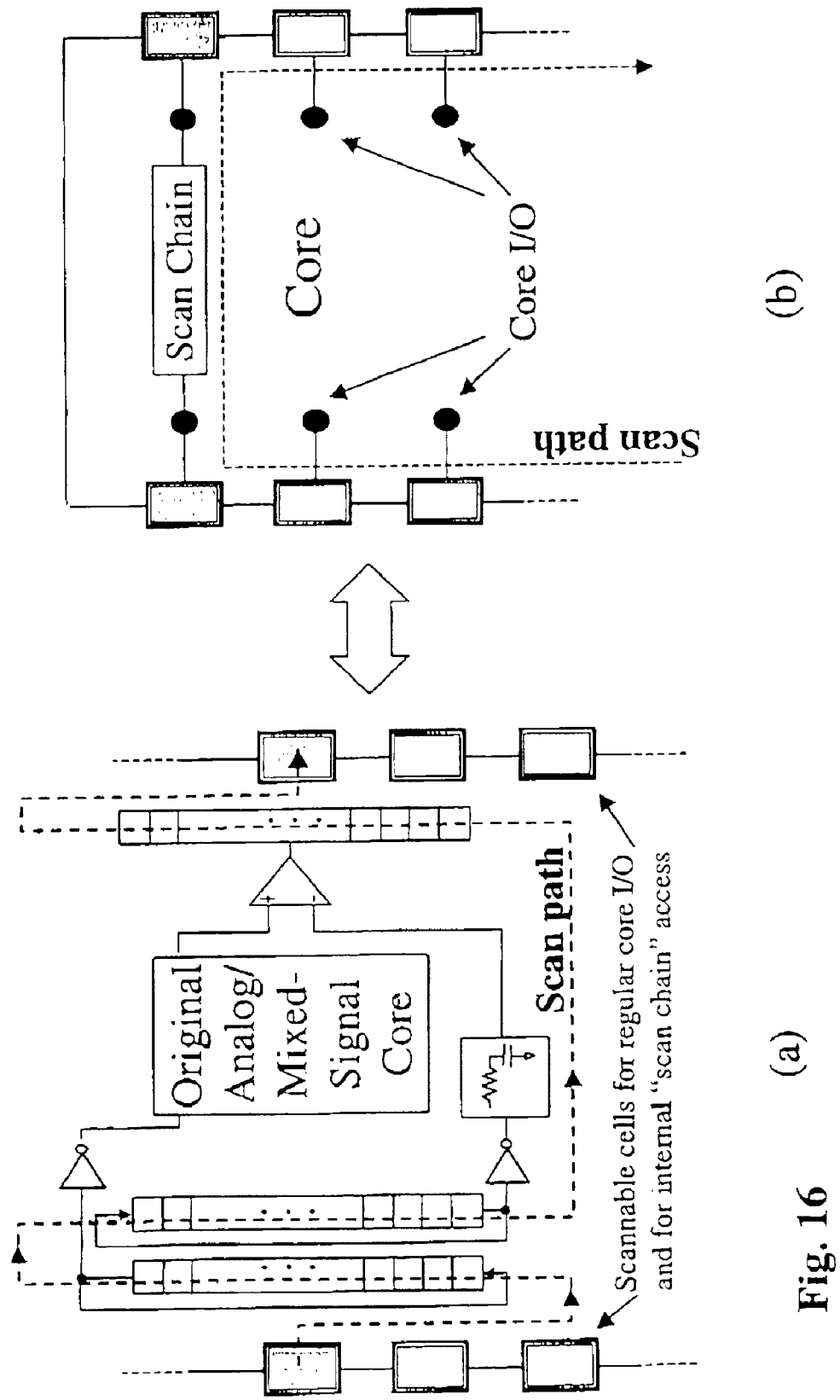
FIGS. 16a and 16b show I/O mechanisms for the invention of FIG. 5.

FIG. 6 illustrates the aggregation of the first and second one-bit memories 200, 202 into a single scan chain. By a similar mechanism, the output memory can also be configured in such a manner. This way, the whole test system 100 may be transformed into a single scan chain. As system 100 is incorporated around a certain analog or mixed-signal block 120, the usual core I/O are augmented with scan I/O. FIG. 16 illustrates this principle. This architecture is similar to digital core wrappers for standardizing access to embedded virtual cores. Multiple test systems may be configured similarly so that they resemble multiple scannable cores on the same chip.

Figure 17:
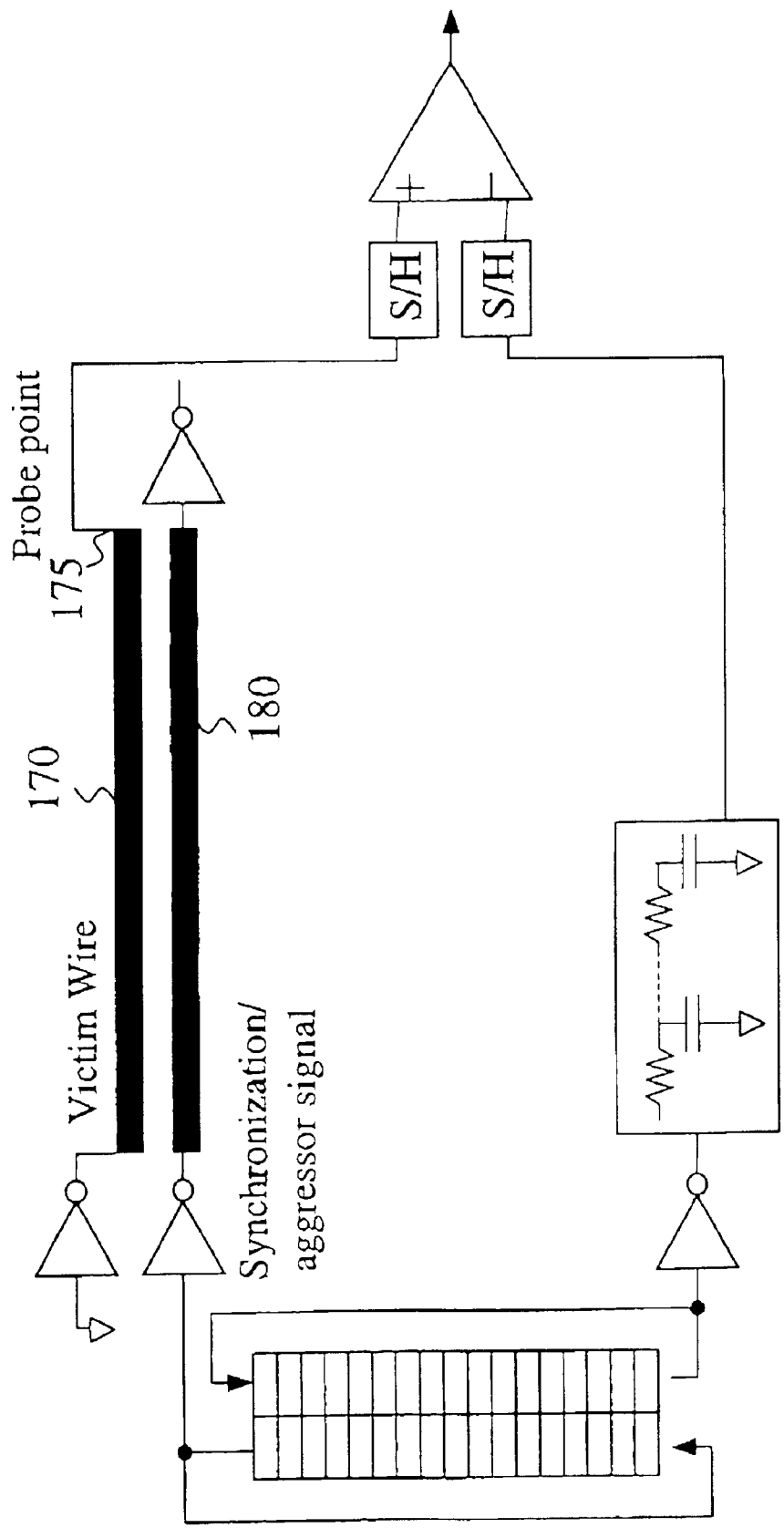
FIG. 17 illustrates a further embodiment of the invention of FIG. 5.

In the preferred embodiment of FIG. 4 and FIG. 5, CUT 120 is a conventional analog or mixed-signal component (e.g. analog filter, amplifier, or data converter). However, the present invention is also envisioned as an on-chip instrument that provides the capability to sample high-speed phenomena at multiple locations on a chip. For example, it was already mentioned that digital signal rise/fall times or serial communication buffers are considered within the realm of devices that can be measured using this test system. Such phenomena are considered analog ones. Similarly, digital signal coupling effects are increasing in importance as on-chip interconnection lengths increase and wire pitch decreases. Such effects can threaten the delivery of "digital" bits over long distances without corruption (hence device failure). In such a case, the proposed test system can also be used as illustrated in FIG. 17 (especially in the characterization and debugging phase). In this figure, the stimulus side is simply used as a synchronization signal to trigger a coupling event onto a victim wire 170 (the CUT in this case). The capture side is located at the desired "probe" location 175 on the wire, and the resulting voltage spike due to coupling from the aggressor wire 180 is measured. Capacitive and inductive parasitics can be deduced from the line response as is done, say, at the printed circuit board level conventionally. Note that the stimulus and capture sides in FIG. 17 could also be the respective components of two instances of test system 100 residing at the respective locations on-chip. Communication between the two systems is established in the digital domain, and the two systems are loaded and configured simultaneously according to the access mechanism described above. Reverse cross-talk (signal coupling as it affects the source of victim line 170) can also be measured by moving the probe point 175 to the beginning of victim line 170. Similarly, the quality of digital signal transmission through a single on-chip wire can also be evaluated according to a connection similar to FIG. 17 in which the input of comparator 206 is connected to the switching line itself, rather than a neighboring one (not shown).

Figure 18A:
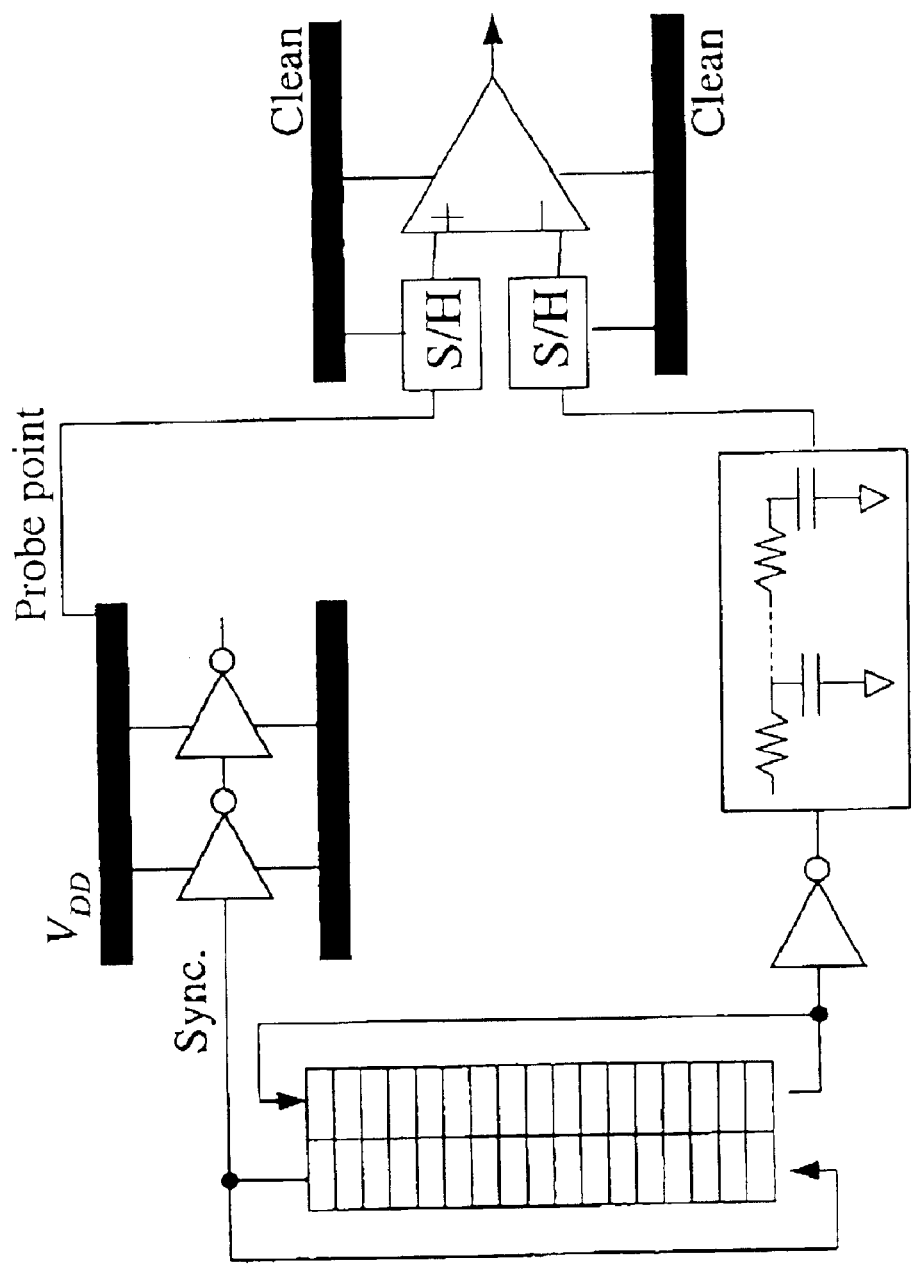
FIGS. 18a and 18b illustrate additional embodiments of the invention of FIG. 5.
Figure 18B:
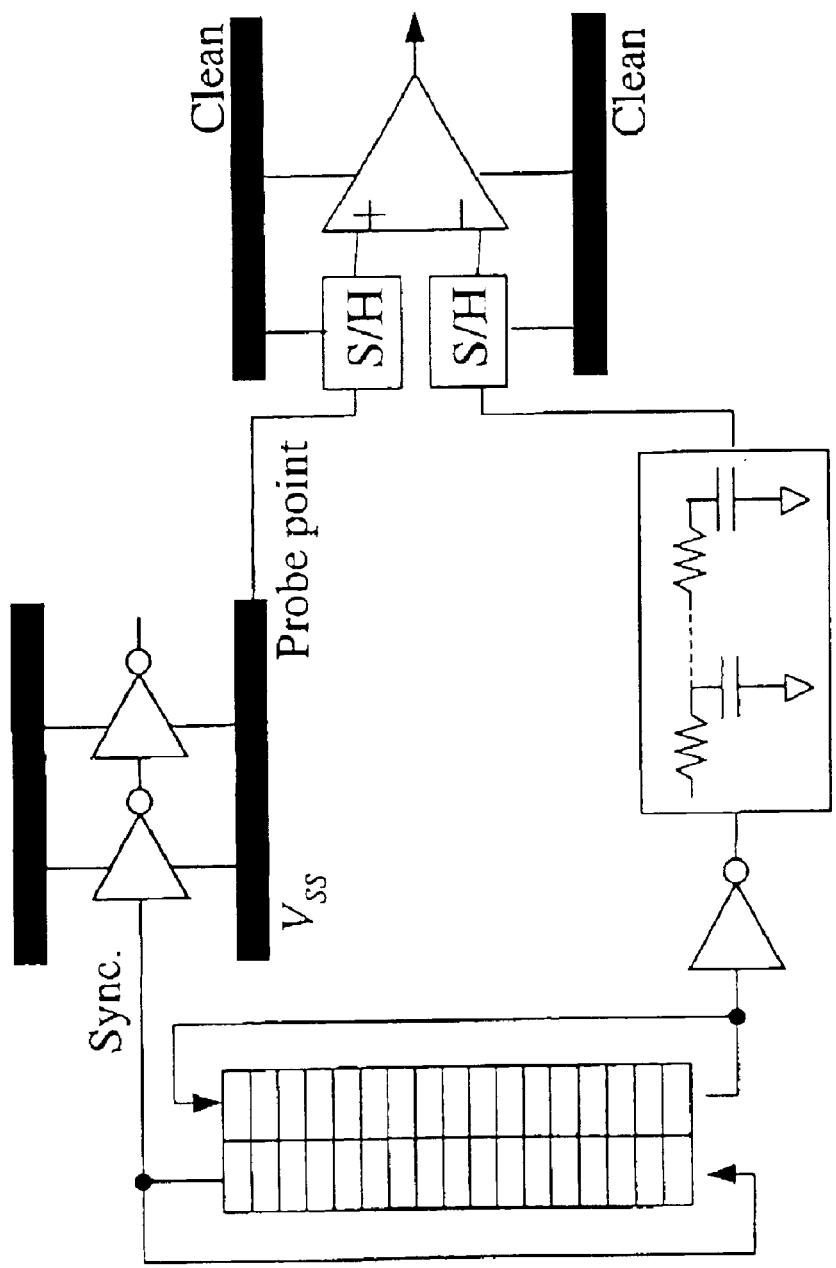

Similarly, CUT 120 can simply be a digital supply rail (or a ground substrate point) as illustrated in FIGS. 18*a* and 18*b*. Again, a trigger signal is periodically generated and the integrated digitizer is used to capture the voltage "bounce" (noise) that results due to the high switching currents of digital circuits. It is assumed in this configuration that the comparator 206, which is the most critical component, is connected to a relatively clean supply, thus being less susceptible to the digitally induced noise.

The present invention is useful in many environments and for many purposes. The invention may be useful as a field tester at the system level, thus providing potential for service cost reductions as field serviceability is becoming a significant portion in many industries. Moreover, the invention may be useful as a "tester" IC for a printed-circuit-board system. If a component on the board is suspected to have failed (after, for example, years of operation), the tester IC could simply be programmed (locally or remotely) to excite the failing component and analyze its output. If the component does indeed fail the test, the component may then be replaced, as applicable.

The embodiment(s) of the invention described above is (are) intended to be exemplary only. The scope of the invention is therefore intended to be limited solely by the scope of the appended claims.

What is claimed is:

1. An integrated excitation/extraction system for test and measurement of a circuit under test (CUT) on a chip, the system comprising:
    a signal generator integrated on the chip for generating a test signal for exciting the CUT; and
    a signal digitizer integrated on the chip for extracting a digital signal for test and measurement from a response signal received from the CUT.

2. The system of claim 1 wherein the signal generator comprises a memory circuit for generating the test signal as a periodic $\Sigma\Delta$ bitstream test signal.

3. The system of claim 2 further comprising an analog reconstruction filter for receiving the periodic $\Sigma\Delta$ bitstream and generating a filtered test signal for communicating to the CUT.

4. The system of claim 3 wherein the reconstruction filter is integrated on the chip.

5. The system of claim 4 further including a means for communicating the filtered test signal to the signal digitizer while bypassing the CUT.

6. The system of claim 2 wherein the memory circuit comprises a sequential shift register.

7. The system of claim 1 wherein the signal generator comprises means for programming the test signal.

8. The system of claim 1 wherein the signal digitizer comprises:
    a reference voltage generator for generating a variable DC reference voltage signal; and
    a comparator for extracting the digital signal in response to the comparison of the response signal and the reference voltage.

9. The system of claim 8 wherein the signal digitizer further comprises a first means for sub-sampling the response signal for communicating to the comparator.

10. The system of claim 9 wherein the signal digitizer further comprises a second means for sub-sampling the reference voltage signal for communicating to the comparator.

11. The system of claim 8 wherein the reference voltage generator comprises:
    a voltage signal generator for encoding a DC voltage level in a periodic bit-stream signal; and
    an averaging circuit to extract the DC reference voltage from the periodic signal.

12. The system of claim 11 wherein the periodic bit-stream signal is a pulse density modulation signal.

13. The system of claim 11 wherein the voltage signal generator comprises a sequential shift register.

14. The system of claim 11 wherein the averaging circuit is a passive RC filter.

15. The system of claim 8 wherein the reference voltage generator comprises means for programming the reference voltage signal.

16. The system of claim 1 wherein the signal digitizer comprises memory means for storing the digital signal.

17. The system of claim 16 wherein the memory means is integrated on the chip.

18. The system of claim 16 wherein the memory means comprises a multi-bit memory having a length at least as long as the length of a unit test period for sampling the response signal.

19. The system of claim 1 further comprising a control means for synchronously controlling the signal digitizer and signal generator.

20. The system of claim 19 wherein the control means is integrated on the chip.

21. The system of claim 19 further comprising programming means for programming the system wherein the signal digitizer is programmed and controlled to extract the digital signal in response to a plurality of samples of the response signal.

22. The system of claim 1 wherein the signal generator comprises a first memory circuit for generating the test signal; wherein the signal digitizer comprises a second memory circuit for generating a DC reference voltage for digitizing the response signal and wherein the first and second memory circuits comprise a single scan-chain integrated on the chip.

23. The system of claim 22 wherein the signal digitizer further comprises a third memory circuit for storing the digital signal and wherein the first, second and third memory circuits comprise a single scan-chain integrated on the chip.

24. The system of claim 1 for test and measurement of a plurality of circuits under test and wherein the system comprises a plurality of signal generators and a plurality of signal digitizers and wherein the system further comprises a means for programming said signal generators and signal digitizers whereby said system is operable to selectively test and measure said circuits under test.

25. The system of claim 1 further comprising a digital signal processor (DSP) for processing the digital signal.

26. The system of claim 1, further including a first electrical connection extending from said signal generator to the CUT and a second electrical connection extending from the CUT to said signal digitizer, each of said first and second electrical connections being located entirely aboard the chip.

27. An excitation/extraction method for test and measurement of a circuit under test (CUT) on a chip, the method comprising the steps of:
    generating a test signal for exciting the CUT, by a signal generator integrated on the chip; and extracting a digital signal for test and measurement from a response signal received from the CUT, by a signal digitizer integrated on the chip.

28. The method of claim 27 wherein the step of generating comprises a generating the test signal as a periodic ΣΔ bitstream.

29. The method of claim 28 wherein the step of generating further comprises filtering the periodic ΣΔ bitstream and generating a filtered test signal for communicating to the CUT.

30. The method of claim 29 wherein the steps of reconstruction filtering is performed on the chip.

31. The method of claim 30 further including the step of communicating the filtered test signal to the signal digitizer while bypassing the CUT.

32. The method of claim 27 further including the step of programming the signal generator with the test signal.

33. The method of claim 27 wherein the step of extracting comprises:

generating a variable DC reference voltage signal; and comparing the response signal and the reference voltage to digitize the digital signal.

34. The method of claim 33 wherein the step of comparing further comprises sub-sampling the response signal.

35. The method of claim 34 wherein the step of comparing further comprises sub-sampling the reference voltage signal.

36. The method of claim 33 wherein the step of generating comprises:

generating a signal encoding a DC voltage level in a periodic bit-stream signal; and averaging the periodic bit-stream signal to extract the DC reference voltage.

37. The method of claim 36 wherein the periodic bit-stream signal is a pulse density modulation signal.

38. The method of claim 36 wherein the step of averaging comprises is a passively filtering the periodic bit-stream.

39. The method of claim 33 further comprising the step of programming the reference voltage signal.

40. The method of claim 27, wherein the chip includes an external electrical contact and the method further comprising the step of initiating the step of generating a test signal via the external electrical contact.

41. A system, comprising:

an integrated circuit chip;

a circuit under test (CUT) operatively configured to generate a response signal as a function of a test signal;

a signal generator operatively configured to generate said test signal, said signal generator electrically coupled with said CUT so as to provide said test signal to said CUT; and a signal digitizer electrically coupled with said CUT so as to receive said response signal from said CUT, said signal digitizer operatively configured to extract from said response signal a digital signal for test and measurement;

wherein said circuit under test, said signal generator and said signal digitizer are contained on said integrated circuit chip.

* * * * *